(12) United States Patent
Myung et al.

(10) Patent No.: US 8,689,093 B2
(45) Date of Patent: Apr. 1, 2014

(54) METHOD AND APPARATUS FOR CHANNEL ENCODING AND DECODING IN A COMMUNICATION SYSTEM USING A LOW-DENSITY PARITY CHECK CODE

(75) Inventors: Se-Ho Myung, Suwon-si (KR); Hong-Sil Jeong, Seoul (KR); Sung-Ryul Yun, Suwon-si (KR); Jae-Yoel Kim, Suwon-si (KR); Hyun-Koo Yang, Seoul (KR); Hak-Ju Lee, Incheon (KR); Jin-Hee Jeong, Yongin-si (KR)

(73) Assignee: Samsung Electronics Co., Ltd (KR)

( * ) Notice: Subject to any disclaimer, the term of this patent is extended or adjusted under 35 U.S.C. 154(b) by 327 days.

(21) Appl. No.: 12/962,262

(22) Filed: Dec. 7, 2010

(65) Prior Publication Data

US 2011/0138262 A1 Jun. 9, 2011

(30) Foreign Application Priority Data

Dec. 7, 2009 (KR) ........................ 10-2009-0120572

(51) Int. Cl.
*H03M 13/51* (2006.01)

(52) U.S. Cl.
USPC ......................................................... 714/806

(58) Field of Classification Search
None
See application file for complete search history.

(56) References Cited

U.S. PATENT DOCUMENTS

| | | | |
|---|---|---|---|
| 7,581,159 B2 * | 8/2009 | Hocevar | 714/790 |
| 7,584,406 B2 * | 9/2009 | Niu et al. | 714/790 |
| 7,620,880 B2 * | 11/2009 | Niu et al. | 714/790 |
| 2007/0011567 A1 | 1/2007 | Choi et al. | |
| 2009/0070652 A1 | 3/2009 | Myung et al. | |
| 2009/0222706 A1 | 9/2009 | Myung et al. | |

FOREIGN PATENT DOCUMENTS

| | | |
|---|---|---|
| KR | 1020060118190 | 11/2006 |
| KR | 1020090026709 | 3/2009 |
| KR | 1020090095432 | 9/2009 |

OTHER PUBLICATIONS

Tian et al., "Construction of Rate Compatible LDPC Codes Utilizing Information Shortening and Parity Puncturing", EURASIP Journal on Wireless Communications and Networking, Oct. 2005.
Klinc et al., "Optimized Puncturing and Shortening Distributions for Nonbinary LDPC Codes over the Binary Erasure Channel", Forty-Sixth Annual Allerton Conference on Communication, Control and Computing, Sep. 2008.
Kim et al., "Design of Rate Compatible Irregular LDPC Codes for Incremental Redundancy Hybrid ARQ Systems"ISIT 2006, Jul. 9-14, 2006.
Xi Huang et al., "Girth 4 and Low Minimum Weights' Problems of LDPC Codes in DVB-S2 and Solutions", XP-002709669, Sep. 26, 2009.

* cited by examiner

*Primary Examiner* — Michael Maskulinski
(74) *Attorney, Agent, or Firm* — The Farrell Law Firm, P.C.

(57) ABSTRACT

A method is provided for channel encoding in a communication system using a Low-Density Parity Check (LDPC) code. The method includes grouping information bits into a plurality of groups; determining an order of the plurality of groups to be shortened, based on a ratio of a number of bits to be shortened to a number of bits to be punctured; determining a length of an information word to be obtained by shortening the plurality of groups; shortening the plurality of groups on a group basis in the determined order based on the determined length of the information word; and LDPC-encoding a shortened information word.

12 Claims, 11 Drawing Sheets

FIG.5

METHOD AND APPARATUS FOR CHANNEL ENCODING AND DECODING IN A COMMUNICATION SYSTEM USING A LOW-DENSITY PARITY CHECK CODE

PRIORITY

This application claims priority under 35 U.S.C. §119(a) to a Korean Patent Application filed in the Korean Intellectual Property Office on Dec. 7, 2009 and assigned Serial No. 10-2009-0120572, the entire disclosure of which is hereby incorporated by reference.

BACKGROUND OF THE INVENTION

1. Field of the Invention

The present invention relates generally to a communication system using a Low-Density Parity Check (LDPC) code, and more particularly, to a channel encoding/decoding method and apparatus for supporting various codeword lengths or code rates using a given LDPC code.

2. Description of the Related Art

In wireless communication systems, link performances are significantly degraded by various noises, fading of channels, and Inter-Symbol Interference (ISI). Therefore, to realize high-speed digital communication systems requiring high data throughput and reliability, such as a next-generation mobile communication system, a digital broadcasting system, and a mobile Internet system, it is important to develop technologies for coping with the noises, fading, and ISI. Recently, error-correcting codes have been studied for improving communication reliability by efficiently restoring information distortion.

An LDPC code, which was first introduced as a typical example of the error-correcting code by Gallager in 1960s, has been long forgotten due to its implementation complexity far exceeding the then technology. However, the LDPC code was restudied in late 1990s, proving that the LDPC code has performance close to Shannon's channel capacity, if decoded by sum-product algorithm-based iterative decoding on a Tanner graph corresponding to the LDPC code. Therefore, the LDPC code is now again being used or considered for use in various systems.

The LDPC code can be commonly defined by a parity check matrix, and can be represented using a bipartite graph called a Tanner graph. The bipartite graph includes two different types of vertexes, which are called variable nodes and check nodes. The variable nodes correspond to encoded bits on a one-to-one basis, and the check nodes represent algebraic relationships between the encoded bits.

FIG. 1 illustrates an example of a parity check matrix $H_1$ of an LDPC code having four rows and eight columns. Referring to FIG. 1, the parity check matrix $H_1$ generates a codeword with a length of 8, because it has eight columns.

FIG. 2 illustrates a Tanner graph corresponding to the parity check matrix $H_1$ of the LDPC code, as illustrated in FIG. 1.

Referring to FIG. 2, the Tanner graph includes eight variable nodes $x_1$ 202, $x_2$ 204, $x_3$ 206, $x_4$ 208, $x_5$ 210, $x_6$ 212, $x_7$ 214, and $x_8$ 216, and four check nodes 218, 220, 222, and 224. An i-th column and a j-th row in the parity check matrix $H_1$ correspond to a variable node $x_i$ and a j-th check node, respectively. A value of 1, i.e., a non-zero value, at the point where an i-th column and a j-th row cross in the parity check matrix $H_1$ indicate that an edge exists between the variable node $x_i$ and the j-th check node on the Tanner graph, as illustrated in FIG. 2.

In the Tanner graph, a degree of each of the variable nodes and the check nodes means the number of edges connected thereto, and is identical to the number of entries, which are not zero (0) in columns or rows corresponding to their associated nodes in the parity check matrix. For example, in FIG. 2, degrees of the variable nodes $x_1$ 202, $x_2$ 204, $x_3$ 206, $x_4$ 208, $x_5$ 210, $x_6$ 212, $x_7$ 214, and $x_8$ 216 are 4, 3, 3, 3, 2, 2, 2, and 2, respectively, and degrees of the check nodes 218, 220, 222, and 224 are 6, 5, 5, and 5, respectively. As mentioned above, the number of non-zero entries in columns in the parity check matrix $H_1$ of FIG. 1, which correspond to the variable nodes of FIG. 2, are equal to the above degrees 4, 3, 3, 3, 2, 2, 2, and 2 in order, and the number of non-zero entries in rows in the parity check matrix $H_1$ of FIG. 1, which correspond to the check nodes of FIG. 2, are identical to the above degrees 6, 5, 5, and 5 in order.

To represent a degree distribution for nodes of an LDPC code, it is assumed that a ratio of the number of variable nodes with a degree i to the total number of variable nodes is represented by $f_i$ and a ratio of the number of check nodes with a degree j to the total number of check nodes is represented by $g_j$. For example, for the LDPC code corresponding to FIGS. 1 and 2, $f_2$=4/8, $f_3$=3/8, and $f_4$=1/8, and $f_i$=0 for i≠2, 3, 4; and $g_5$=3/4 and $g_6$=1/4, and $g_j$=0 for j≠5, 6. Assuming that a length (i.e., the number of columns) of an LDPC code is N and the number of rows is N/2, a density of non-zero entries in the entire parity check matrix having the above degree distribution is calculated using Equation (1) below.

$$\frac{2f_2 N + 3f_3 N + 4f_4 N}{N \cdot N/2} = \frac{5.25}{N} \quad (1)$$

In Equation (1), increasing N decreases the density of a weight of 1 in the parity check matrix. For an LDPC code, because its length N is inverse proportional to the density of non-zero entries, an LDPC code with a large N has a very low density of non-zero entries. The phrase 'low density' in the name LDPC code was derived from this principle.

FIG. 3 is a diagram illustrating a conventional LDPC encoding process.

Referring to FIG. 3, the number of bits input to an LDPC encoder 310 is, for example, $K_1$=16, and information bits are represented as, for example, $u=\{u_0, u_1, \ldots, u_{15}\}$. Herein, the bits input to the LDPC encoder 310 will be referred to individually as information bits or collectively as an information word.

The LDPC encoder 310 generates parity bits, and generates an LDPC codeword $c=(u, p)$ by adding the generated parity bits to the input information bits as illustrated in FIG. 3. A process in which the LDPC encoder 310 adds parity bits to information bits using the parity check matrix is referred to as an LDPC encoding process.

Because an LDPC code is defined by a parity check matrix, a given system stores the parity check matrix in order to apply the LDPC code. Generally, to store an LDPC code, position information of a weight of 1 in the parity check matrix is stored. However, because a codeword length of an LDPC code used in the actual system ranges from hundreds of bits to hundreds of thousands of bits, the memory required to store the position information of a weight of 1 can become very large in capacity if the codeword length of the LDPC code is very long.

To overcome these shortcomings, many studies have been conducted on LDPC codes with various parity check matrixes having specific structures. For a parity check matrix having a specific structure, because positions of a weight of 1 are limited in its parity check matrix according to a specific condition, the positions of a weight of 1 can be stored more efficiently.

FIG. 4 is a diagram illustrating a parity check matrix having the specific structure.

Referring to FIG. 4, $N_1$ represents a length of an LDPC codeword, which is equal to a length of its parity check matrix. $K_1$ represents a length of an information word (or the number of information bits), which is equal to a length of an information part of the parity check matrix, and $(N_1-K_1)$ represents a length of parity bits, which is equal to a length of a parity part of the parity check matrix. Integers $M_1$ and q are determined so as to meet $q=(N_1-K_1)/M_1$. $K_1/M_1$ is also an integer.

In the parity check matrix of FIG. 4, positions of a weight of 1 in a $K_1$-th column to an $(N_1-1)$-th column, which are a part corresponding to the parity bits, have a dual diagonal structure. Therefore, it can be understood that degrees of columns corresponding to the parity bits are all 2, except for a degree of the $(N_1-1)$-th column, which is 1.

Referring to FIG. 4, in the parity check matrix, a structure of a 0-th column to a $(K_1-1)$-th column, which corresponds to an information part, can be made according to the following rules.

Rule 1: In the parity check matrix, a total of $K_1/M_1$ column groups are generated by grouping $K_1$ columns corresponding to an information word into a plurality of groups each including $M_1$ columns. Columns in each column group are generated according to Rule 2 below.

Rule 2: First, positions of 1 in a 0-th column in an i-th ($i=1, \ldots, K_1/M_1$) column group are determined. Second, assuming that a degree of a 0-th column in each i-th column group is represented by $D_i$, if positions of rows with 1 are $R_{i,0}^{(1)}, R_{i,0}^{(2)}, \ldots, R_{i,0}^{(D_i)}$, then positions $R_{i,j}^{(k)}(k=1, 2, \ldots, D_i)$ of rows with 1 in a j-th ($j=1, 2, \ldots, M_1-1$) column in an i-th column group are defined as shown in Equation (2) below.

$$R_{i,j}^{(k)} = R_{i,(j-1)}^{(k)} + q \bmod (N_1-K_1)$$

$$k=1, 2, \ldots, D_i, i=1, \ldots, K_1/M_1, j=1, \ldots, M_1-1 \quad (2)$$

According to Rules 1 and 2, it is noted that degrees of columns in an i-th (i) column group are all equal to $D_i$. Now, as a more detailed example, for $N_1=30$, $K_1=15$, $M_1=5$ and $q=3$, position information of rows with 1 in a 0-th column in each of three column groups may be represented in the following three sequences. These sequences are referred to as "weight-1 position sequences".

$R_{1,0}^{(1)}=1, R_{1,0}^{(2)}=2, R_{1,0}^{(3)}=8, R_{1,0}^{(4)}=10$,
$R_{2,0}^{(1)}=0, R_{2,0}^{(2)}=9, R_{2,0}^{(3)}=13$,
$R_{3,0}^{(1)}=0, R_{3,0}^{(2)}=14$.

As to the weight-1 position sequences for positions of rows with 1 in a 0-th column in each column group, only their sequences are also represented on a column group basis as follows, for convenience.

1 2 8 10
0 9 13
0 14

That is, the i-th weight-1 position sequence sequentially represents position information of rows with 1 in an i-th column group.

FIG. 5 is a diagram illustrating an example of a parity check matrix of an LDPC code. Specifically, the parity check matrix illustrated in FIG. 5 is generated by constructing a parity check matrix using the information corresponding to the above detailed example, and Rules 1 and 2.

To apply an LDPC code to an actual communication system, the LDPC code should be generated in consideration of a required data rate in the communication system. In particular, not only in an adaptive communication system employing Hybrid Automatic Retransmission Request (HARQ) and Adaptive Modulation and Coding (AMC), but also in a communication system supporting various broadcast services, LDPC codes having various codeword lengths are required to support various data rates required by the systems.

However, in order to support LDPC codes having various codeword lengths or code rates, a high-capacity memory is required to store parity check matrixes corresponding to different codeword lengths or code rates. In particular, an increase in the number of types of the supported codeword lengths or code rates also lead to an increase in the required memory capacity, thereby reducing the system efficiency. Therefore, there is a need for more efficiently supporting a variety of codeword lengths or code rates using a given, existing parity check matrix, without generating new parity check matrixes corresponding to different codeword lengths or code rates.

SUMMARY OF THE INVENTION

The present invention is designed to address at least the above-mentioned problems and/or disadvantages and to provide at least the advantages described below.

Accordingly, an aspect of the present invention is to provide a channel encoding and decoding method and apparatus for generating LDPC codes having different codeword lengths and code rates by shortening or puncturing a given parity check matrix in a communication system using an LDPC code.

Another aspect of the present invention is to provide a channel encoding and decoding method and apparatus for determining a shortening pattern considering a number of shortened bits and a number of punctured bits in a communication system using an LDPC code.

Another aspect of the present invention is to provide a channel encoding and decoding method and apparatus for performing shortening using a shortening pattern predetermined considering a number of shortened bits and a number of punctured bits in a communication system using an LDPC code.

Another aspect of the present invention is to provide a channel encoding and decoding method and apparatus for ensuring optimal performance by considering a specific structure in a communication system using an LDPC code having the specific structure.

In accordance with an aspect of the present invention, a method is provided for channel encoding in a communication system using an LDPC code. The method includes grouping information bits into a plurality of groups; determining an order of the plurality of groups to be shortened, considering a ratio of a number of bits to be shortened to a number of bits to be punctured; determining a length of an information word to be obtained by shortening the plurality of groups; shortening the plurality of groups on a group basis in the determined order based on the determined length of the information word; and LDPC-encoding the shortened information word.

In accordance with another aspect of the present invention, an apparatus is provided for channel encoding in a communication system using an LDPC code. The apparatus includes a parity check matrix extractor for grouping information bits into a plurality of groups, and determining an order of the plurality of groups to be shortened, considering a ratio of a number of bits to be shortened to a number of bits to be punctured; a shortening pattern applying unit for determining a length of an information word to be obtained by shortening the plurality of groups, and shortening the plurality of groups on a group basis in the determined shortening order based on the determined length of the information word; and an encoder for LDPC-encoding the shortened information word.

In accordance with another aspect of the present invention, a method is provided for decoding a channel in a communication system using an LDPC code. The method includes demodulating a signal transmitted from a transmitter; determining from the demodulated signal whether a shortened bit exists; if the shortened bit exists, determining a position of the shortened bit based on a shortening pattern determined considering a ratio of a number of bits to be shortened to a number of bits to be punctured; and decoding data using the determined position of the shortened bit. The shortening pattern is determined on a group basis.

In accordance with another aspect of the present invention, an apparatus is provided for decoding a channel in a communication system using an LDPC code. The apparatus includes a demodulator for demodulating a signal transmitted from a transmitter; a shortening pattern determiner for determining from the demodulated signal whether a shortened bit exists, and if the shortened bit exists, determining a position of the shortened bit based on a shortening pattern determined considering a ratio of a number of bits to be shortened to a number of bits to be punctured; and a decoder for decoding data using the determined position of the shortened bit. The shortening pattern is determined on a group basis.

BRIEF DESCRIPTION OF THE DRAWINGS

The above and other aspects, features, and advantages of certain embodiments of the present invention will be more apparent from the following description taken in conjunction with the accompanying drawings, in which:

FIG. 5 is a diagram illustrating an example of a parity check matrix of an LDPC code;

Throughout the drawings, the same drawing reference numerals will be understood to refer to the same elements, features, and structures.

DETAILED DESCRIPTION OF EMBODIMENTS OF THE INVENTION

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

In accordance with an embodiment of the present invention a method for supporting LDPC codes having a variety of codeword lengths or code rates using a parity check matrix in a specific form is provided. In accordance with another embodiment of the present invention an apparatus supporting various codeword lengths or code rates in a communication system that encodes an LDPC code using a parity check matrix in a specific form is provided.

Figure 6:
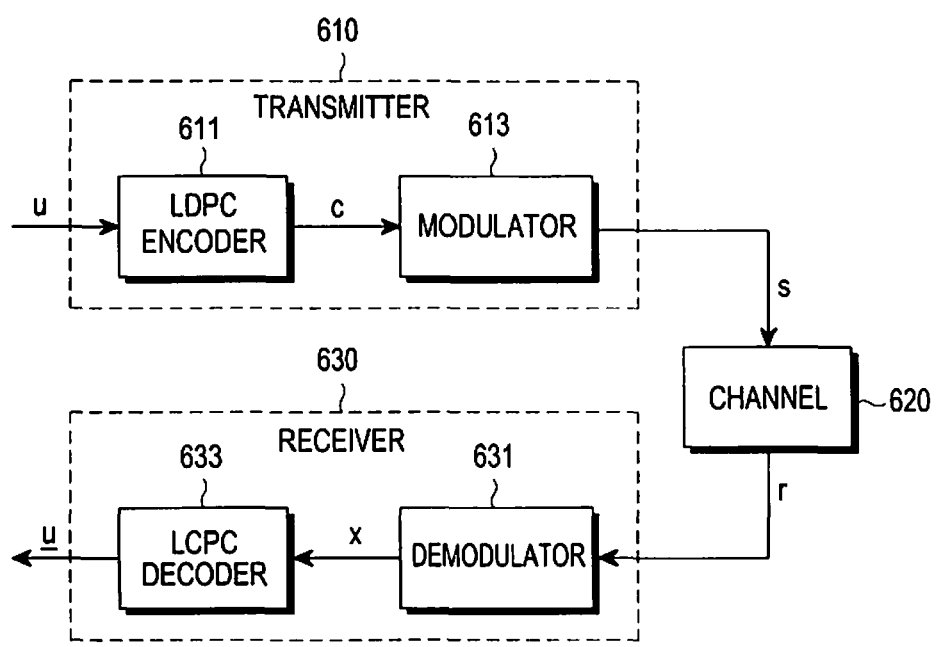
FIG. 6 is a block diagram illustrating a transceiver in a communication system using an LDPC code.

FIG. 6 is a block diagram illustrating a transceiver in a communication system using an LDPC code.

Referring to FIG. 6, a message u to be sent is input to an LDPC encoder 611 in a transmitter 610. The LDPC encoder 611 transfers, to a modulator 613, a signal or a codeword c that is obtained by encoding the input message u. The modulator 613 modulates the codeword c and transmits a modulated signal s to a receiver 630 over a channel 620. A demodulator 631 in the receiver 630 demodulates a signal r received from the transmitter 610, and outputs a demodulated signal x to an LDPC decoder 633. The LDPC decoder 633 decodes the demodulated signal x to estimate an estimate $\underline{u}$ of the message.

More specifically, the LDPC encoder 611 generates the codeword c by selecting a parity check matrix corresponding to a codeword length or code rate required by a communication system using a preset scheme. Particularly, an embodiment of the present invention provides a method in which the LDPC encoder 611 can support various codeword lengths or code rates without the need to store additional information.

In accordance with an embodiment of the present invention, shortening and/or puncturing methods are used to supporting various codeword lengths or code rates.

The shortening method limits a value of a specific bit or a specific part of an information word to '0' or '1'. That is, the shortening method either does not use a specific part, or only uses a specific part of a given parity check matrix. For a better understanding of the shortening method, reference will be made in detail to the parity check matrix of the LDPC code illustrated in FIG. 4.

Figure 4:
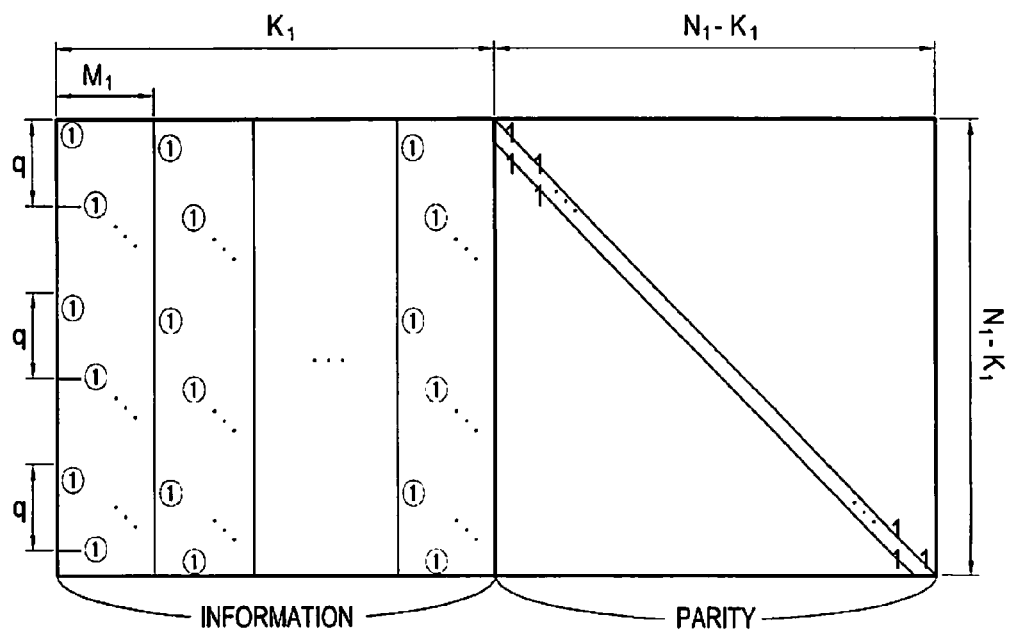
FIG. 4 is a diagram illustrating a structure of a parity check matrix.

The parity check matrix of the LDPC code illustrated in FIG. 4 is $N_1$ in its total length, an information part representing a front part of the parity check matrix corresponds to information bits $(i_0, i_0, \ldots, i_{K_1-1})$ with a length of $K_1$, and a parity part representing a rear part of the parity check matrix corresponds to parity bits $(p_0, p_0, \ldots, p_{N_1-K_1-1})$ with a length of $N_1-K_1$. Commonly, information bits freely have a value of 0 and 1, but in the shortening method, values of information bits in a specific part to be shortened are limited, as described above.

Figures 1, 2:
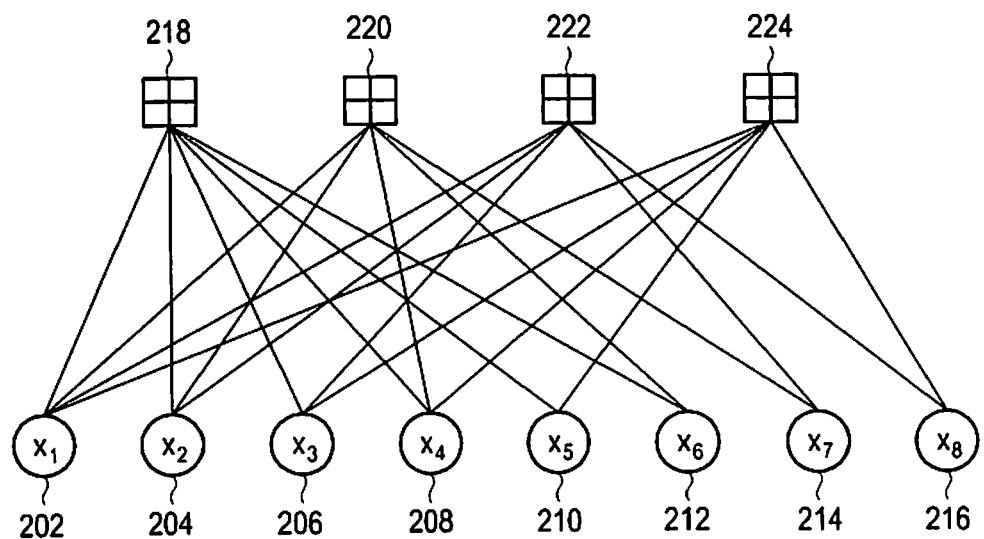
FIG. 1 is a diagram illustrating an example of a parity check matrix of an LDPC code with a length of 8.
FIG. 2 is a diagram illustrating an exemplary Tanner graph of a parity check matrix of an LDPC code with a length of 8.
Figure 3:
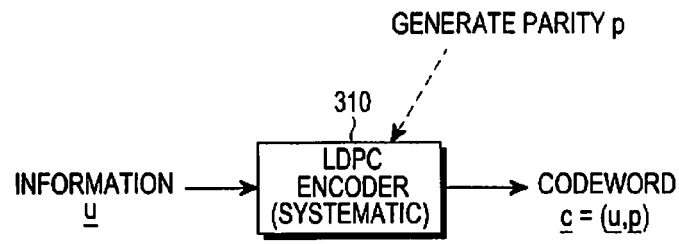
FIG. 3 is a block diagram illustrating an LDPC encoding process.

For example, shortening $N_s$ information bits $i_0$ to $i_{N_s-1}$ commonly means $i_0=i_1=\ldots=i_{N_s-1}=0$. That is, shortening is performed by limiting values of $N_s$ information bits $i_0$ to $i_{N_s-1}$ to 0. Alternatively, shortening may be performed by not using $N_s$ columns of an information part in the parity check matrix illustrated FIG. 3, as described above. That is, the shortening method of limiting values of specific information bits to 0 may be implemented by a shortening method of removing or not using columns corresponding to the information bits whose values are limited to 0, in the parity check matrix. Therefore, the shortening method of limiting values of specific information bits or a bit group to 0 may be replaced with the shortening method of removing corresponding columns or column group in the parity check matrix. As described above, information bits correspond to an information part of a parity check matrix, and a bit group is a group of information bits corresponding to a column group in the parity check matrix.

In the following description, even though any the various embodiments of the present invention may be described with reference to only one of the shortening methods, the other shortening method would also be available. Through these shortening methods, because position information about shortened information bits may be equally shared or generated by a transmitter and a receiver during system setting, even though the transmitter does not transmit shortened information bits, the receiver may perform decoding, knowing values of information bits in the positions of the shortened information bits.

By using the shortening method, because a length of a codeword actually transmitted by a transmitter is $N_1-N_s$ and a length of an actual information word is $K_1-N_s$, a code rate becomes $(K_1-N_s)/(N_1-N_s)$, which is less than the first given code rate $K_1/N_1$.

A puncturing method may be generally applied to both information bits and parity bits. While both the puncturing method and the shortening method shorten a codeword length, the puncturing method, unlike the shortening method, does not limit values of specific bits. Instead, the puncturing method simply does not transmit specific information bits, or specific bits or a specific part among generated parity bits, so they undergo erasure processing in a receiver. In other words, simply not transmitting $N_p$ bits in predetermined positions in a generated LDPC code with a length of $N_1$ is equivalent to transmitting an LDPC code with a length of $N_1-N_p$. Because columns corresponding to punctured bits in a parity check matrix are used intact in a decoding process, the puncturing method is different from the shortening method.

Because position information about punctured bits may be equally shared or estimated by a transmitter and a receiver during system setting, the receiver may simply perform erasure processing on the punctured bits during decoding.

Figure 7:
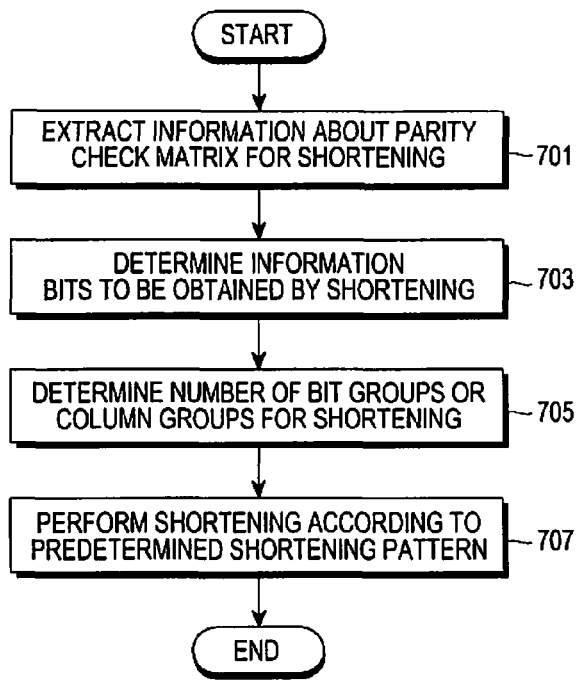
FIG. 7 is a flowchart illustrating a shortening process in a communication system using an LDPC code.

FIG. 7 is a flow chart illustrating a shortening process in a communication system using an LDPC code, which is applied to the present invention.

In step 701, an LDPC encoder extracts information about a parity check matrix for shortening. The parity check matrix information may be at least one of a stored parity check matrix, a part of a parity check matrix, and parameters of a parity check matrix, e.g., information about a weight-1 position sequence, a length of or the number of column groups of a parity check matrix, etc. The LDPC encoder determines $(K_1-K_2)$ information bits to be obtained by shortening in step 703, and determines the number of bit groups or column groups for shortening in step 705. In step 707, the LDPC encoder performs shortening according to at least one of shortening patterns as defined in Tables 2 and 3 below. In accordance with an embodiment of the present invention, the shortening patterns defined in Tables 2 and 3 are determined considering a ratio of a number of bits to be shortened to a number of bits to be punctured.

Figure 5:
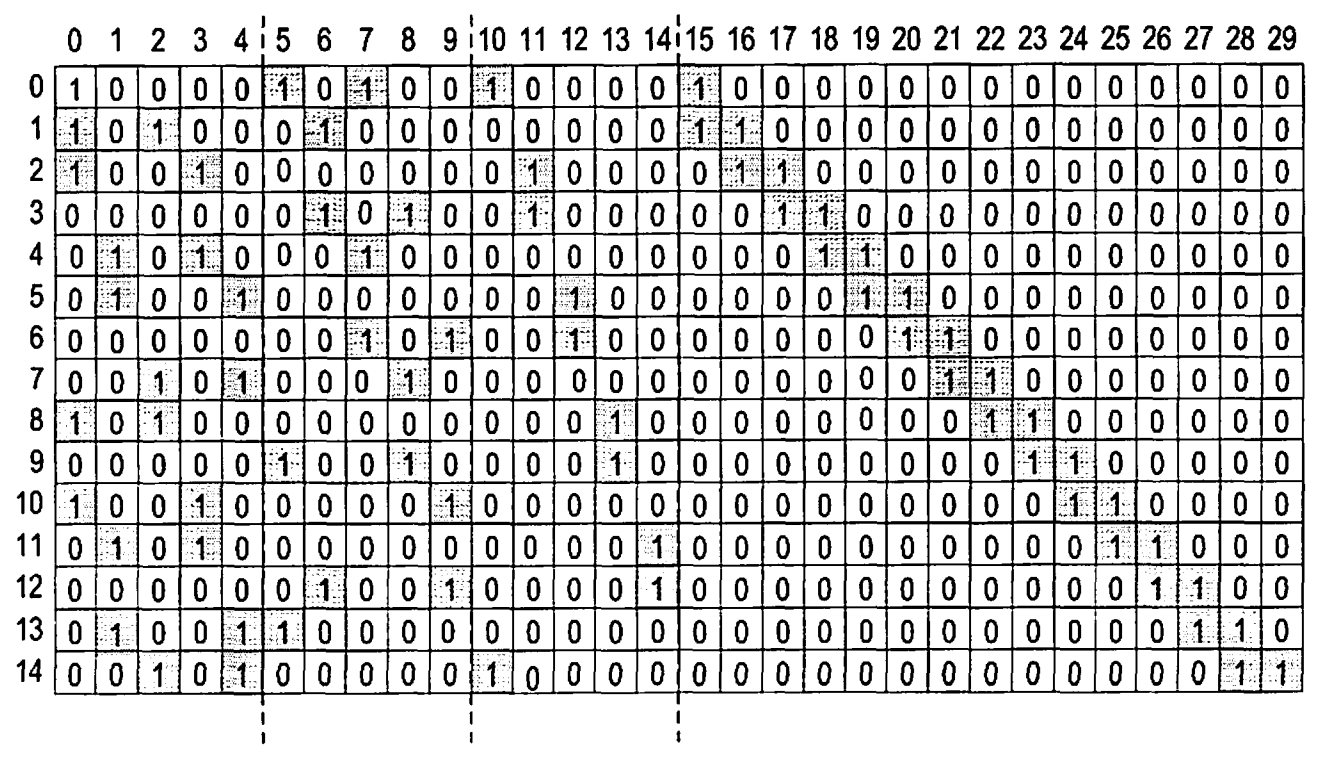

An information part of the parity check matrix includes a plurality of column groups, e.g., $K_1/M_1=3$, as illustrated in FIG. 5. In a parity check matrix of an LDPC code, because columns correspond to information bits of the LDPC code on a one-to-one basis, the column group corresponds to a specific bit group of information bits.

Figure 8:
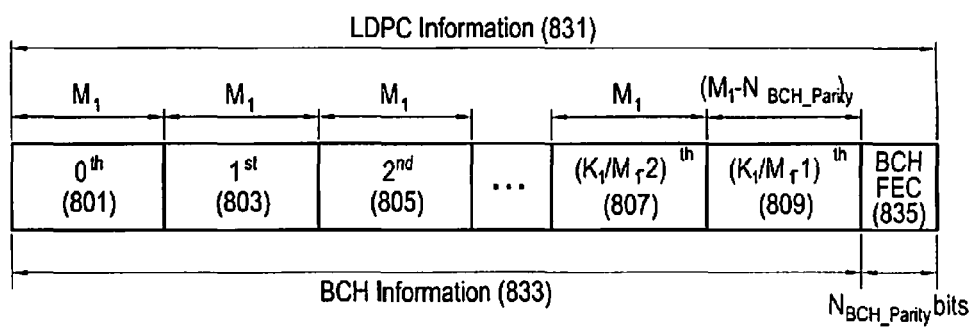
FIG. 8 is a diagram illustrating an information part of an LDPC code.

FIG. 8 is a diagram illustrating an information part of an LDPC codeword.

Referring to FIG. 8, an LDPC codeword may be generated by being concatenated to a Bose-Chaudhuri-Hocquenghem (BCH) code. That is, BCH coding (or BCH outer coding) is performed by adding a BCH parity 835 to an information word 833 (the information word 833 can be referred to as BCH information word for separation from LDPC information word 831), and LDPC encoding (or LDPC inner coding) is performed by adding an LDPC parity to the result obtained by adding the BCH parity 835 to the BCH information word 833. The result of adding a BCH parity to the information word 833 is referred to as an LDPC information word 831. Therefore, as illustrated in FIG. 8, the LDPC information word 831 of an LDPC code may be subdivided into a part corresponding to the BCH information word 833 and a part corresponding to the BCH parity 835.

Referring to FIG. 8, a length of the BCH parity 835 corresponding to a tail end of the last $(K_1/M_1-1)$-th column group in the parity check matrix of an LDPC code is $N_{BCH\_Parity}$, and a length of the BCH information word 833 is $K_1-N_{BCH\_Parity}$. Because the BCH parity 835 is determined by the BCH information word 833, a length of an information word that is actually adjustable in a system employing an LDPC encoding method, is $K_1-N_{BCH\_Parity}$. Therefore, shortening cannot be applied to the BCH parity bits 835 with a length of $N_{BCH\_Parity}$. When shortening cannot be applied to the $N_{BCH\_Parity}$ parity bits, a $(K_1/M_1-1)$-th column group or bit group may be defined to apply shortening, except for the $N_{BCH\_Parity}$ columns or bits therefrom.

Because the LDPC code using a parity check matrix having the above-described specific structure has a special structure in units of column groups or corresponding bit groups, it is preferable to perform shortening on a bit or column group basis to achieve superior performance when application of shortening is required.

Figure 9:
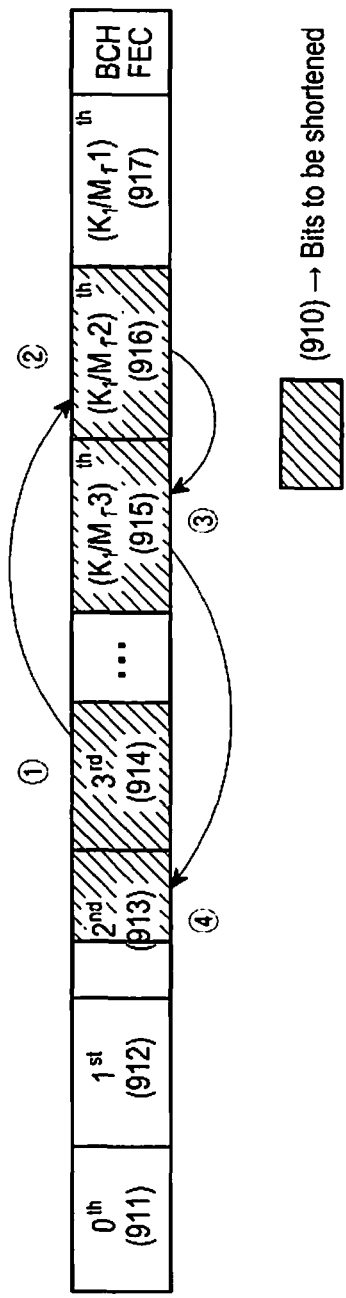
FIG. 9 is a conceptual diagram illustrating a process of shortening an LDPC code on a column group basis.

FIG. 9 illustrates an example of shortening an LDPC code on a bit group basis. In FIG. 9, hatched parts 910 represent bits to be shortened.

If the number of bits to be shortened is determined, a first specific bit group is shortened according to a predetermined order. In FIG. 9, a third bit group 914 is shortened for the first time.

If there are more bits to be shortened, a predetermined second specific bit group is shortened overall. In FIG. 9, a $(K_1/M_1-2)$-th bit group 916 shortened for the second time.

If there are more bits to be shortened, a predetermined third specific bit group is shortened overall. In FIG. 9, a $(K_1/M_1-3)$-th bit group 915 is shortened for the third time.

This process is continuously repeated, and if the number of remaining bits to be shortened is less than a size $M_1$ of one bit group, a part of the bit group is shortened, completing the shortening process. In FIG. 9, a part of a second bit group 913 is shortened for the last time.

An order of bit or column groups to be shortened should be determined in advance, for shortening on a bit or column group basis. However, if both shortening and puncturing should be applied in a given communication system, the order of bit or column groups to be shortened, providing superior performance, may be different disadvantageously, depending on the length of punctured parity bits. If puncturing is applied to parity bits, connectivity between punctured parity bits and information bits affects decoding performance, and their connection properties vary according to the number of punctured bits. For example, information bits most connected to punctured parity bits have a very high performance degradation possibility, and such information bits may be changed depending on the number of punctured parity bits. That is, positions of information bits having a high performance degradation possibility are continuously changed according to the number of punctured parity bits.

Accordingly, when both shortening and puncturing are applied, the optimal order of bit or column groups to be shortened may change according to the length of bits to be punctured.

In accordance with an embodiment of the present invention, a pattern having the best theoretical performance is determined through density evolution analysis according to a predetermined ratio of shortening to puncturing, in order to determine the optimal order of bit or column groups to be shortened, when both shortening and puncturing are applied in an arbitrary system utilizing an LDPC code. Density evolution analysis may be applied by performing erasure processing on punctured bits. The best degree distribution of an information part is calculated, and a shortening pattern satisfying the calculated degree distribution is calculated. If there are several shortening patterns satisfying the degree distribution, a pattern having the best performance is selected through computational experimentation.

An LDPC code with $N_1=16200$, $K_1=3240$, $M_1=360$, and $q=36$ will be considered to describe application of an efficient shortening process using an excellent shortening pattern obtained by the above process of selecting a shortening pattern. The LDPC code has the following weight-1 position sequences.

6295 9626 304 7695 4839 4936 1660 144 11203 5567 6347 12557

10691 4988 3859 3734 3071 3494 7687 10313 5964 8069 8296 11090

10774 3613 5208 11177 7676 3549 8746 6583 7239 12265 2674 4292

11869 3708 5981 8718 4908 10650 6805 3334 2627 10461 9285 11120

7844 3079 10773

3385 10854 5747

1360 12010 12202

6189 4241 2343

9840 12726 4977

The sequence of an i-th row sequentially represents position information of rows with 1 in an i-th column group. Therefore, the LDPC code includes nine column groups and a length of an information word of the LDPC code is 9×360=3240. Once a length of a codeword or an information word to be obtained by applying shortening or puncturing is determined, an optimized shortening pattern can be calculated.

When an LDPC code is generated by being concatenated to a BCH code, shortening cannot be applied to a part corresponding to BCH parity bits in an information word of the LDPC code. The BCH parity bits correspond to a tail end of the last $(K_1/M_1-1)$-th column group in the information word of the LDPC code, and a length thereof is represented by $N_{BCH\_Parity}$. A length of a BCH information word is $K_1-N_{BCH\_Parity}$, and represented by $K_{BCH}$. In addition, because BCH parity bits are determined by a BCH information word, a BCH information word is actually adjustable in a system employing an LDPC encoding method, and its length is $K_{BCH}$.

Detailed examples of a shortening process and shortening patterns for an LDPC code with $N_1=16200$ and $K_1=3240$ are shown in Tables 1 to 3 below, wherein $K_{2,BCH}$ and $K_{2,LDPC}$ represent a length of a BCH information word and a length of an LDPC information word after undergoing shortening, respectively. In Table 1, key parameters are changeable according to requirements of the system, and Tables 2 and 3 are also changeable according to the change of Table 1.

TABLE 1

| Key Parameters | $N_1 = 16200$, $K_1 = 3240$, $K_{BCH} = 3072$, $N_{BCH\_Parity} = 168$, $M_1 = 360$, $q = 36$ |
|---|---|
| Step 1) | A value of m is defined as follows according to a value of $K_{2,BCH}$. <br> 1) $m = K_1/M_1 - 1$ for $0 < K_{2,BCH} \leq M_1$ (or $N_{BCH\_Parity} < K_{2,LDPC} \leq M_1 + N_{BCH\_Parity}$). <br> 2) Otherwise, $m = \lfloor \frac{K_{BCH} - K_{2,BCH}}{M_1} \rfloor$. |
| Step 2) | 1) $\pi(0)$-th, $\pi(1)$-th, ..., and $\pi(m-1)$-th bit or column groups are all shortened, where $\pi(\cdot)$ represents a sequence meaning a shortening pattern, and is selected from Tables 2 and 3 below according to a ratio of the number of bits to be shortened to the number of bits to be punctured, or to a code rate. <br> 2) When shortening is applied to a $(K_1/M_1-1)$-th bit or column group, if BCH parity bits with a length of $N_{BCH\_Parity}$ or their corresponding columns are included in the group, shortening cannot be applied to the BCH parity bits or columns. |
| Step 3) | 1) If $m = K_1/M_1 - 1$, shortening is applied to $(M_1 - K_{2,BCH})$ bits or columns in a $\pi(K_1/M_1 - 1)$-th bit or column group. <br> 2) If $m \neq K_1/M_1 - 1$, shortening is applied to $(K_{BCH} - K_{2,BCH} - m \cdot M_1)$ bits or columns in a $\pi(m)$-th bit or column group. <br> 3) When shortening is applied to a $(K_1/M_1 - 1)$-th bit or column group, if BCH parity bits with a length of $N_{BCH\_Parity}$ or their corresponding columns are included in the group, shortening cannot be applied to the BCH parity bits or columns. |

TABLE 2

Number of information bits to be shortened/number of bits to be punctured = 4/15, 3/11

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 7 | 6 | 3 | 5 | 2 | 4 | 1 | 8 | 0 |

TABLE 3

Number of information bits to be shortened/number of bits to be punctured = 2/7

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 7 | 3 | 6 | 5 | 2 | 4 | 1 | 8 | 0 |

If a ratio of a number of bits to be shortened to a number of bits to be punctured is 4/15 or 3/11, an LDPC encoder performs shortening on $7^{th}$, $6^{th}$, $3^{rd}$, $5^{th}$, $2^{nd}$, $4^{th}$, $1^{st}$, $8^{th}$, and $0^{th}$ groups in order, as defined in Table 2. However, if a length of the LDPC code is 16200, a length of the information word is 3240, and a ratio of the number of bits to be shortened to the number of bits to be punctured is 2/7, the LDPC encoder performs shortening on $7^{th}$, $3^{rd}$, $6^{th}$, $5^{th}$, $2^{nd}$, $4^{th}$, $1^{st}$, $8^{th}$, and $0^{th}$ groups in order, as defined in Table 3.

Referring to Step 2) in Table 1, a different shortening pattern is selected depending on a ratio of a number of bits to be shortened to a number of bits to be punctured, and criteria for determining shortening patterns may be expressed in various forms according to the systems. That is, a specific region in a frame has a specific ratio of the number of bits to be shortened to the number of bits to be punctured. If another region, or a part of the another region has a ratio of a number of bits to be shortened to a number of bits to be punctured, which is different from the specific ratio, a different shortening pattern may be selected for the another region, or the part of the another region, according to the specific region instead of the ratio.

Figure 10:
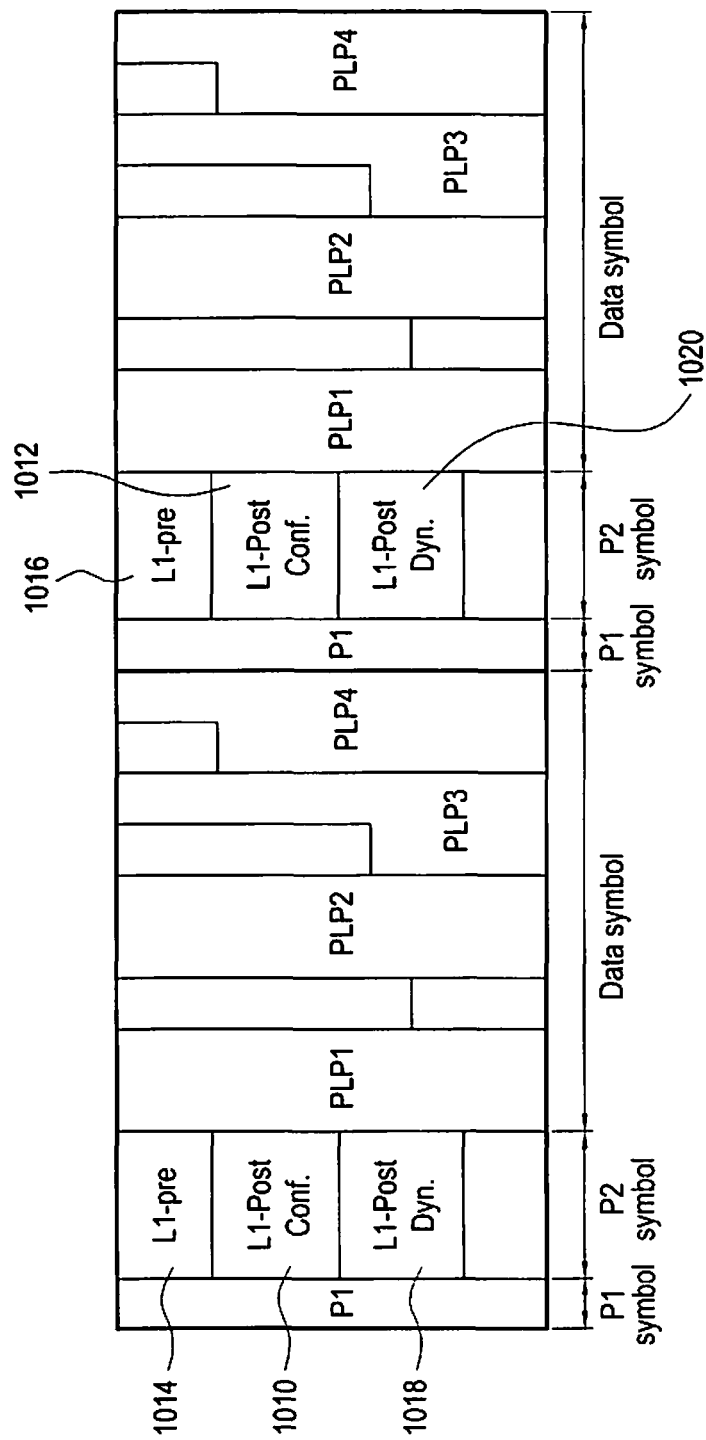
FIG. 10 is a diagram illustrating criteria for determining shortening patterns depending on systems, according to an embodiment of the present invention.

FIG. 10 illustrates examples of criteria for determining shortening patterns depending on systems, according to an embodiment of the present invention.

Referring to FIG. 10, a specific region in a frame is used for signaling in, for example, Digital Video Broadcasting-Second Generation Terrestrial (DVB-T2), DVB-Satellite Second Generation (DVB-S2), DVB-Cable Second Generation (DVB-C2) systems or a DVB-Next Generation Handheld (DVB-NGH) system, which is currently under standardization. In particular, specific signaling regions L1-post configuration 1010 and 1012 may be different from other signaling regions L1-pre 1014 and 1016 and L1-post dynamic 1018 and 1020 in terms of the ratio of the number of shortened bits to the number of punctured bits. In this case, the other regions, i.e., L1-pre 1014 and 1016 and L1-post Dynamic 1018 and 1020, being different from the specific regions L1-post configuration 1010 and 1012, or some regions, e.g., only L1-post Dynamic 1018 and 1020, of the other regions may use different shortening patterns. If a ratio of a number of bits to be shortened to a number of bits to be punctured is different, a code rate may be different. Therefore, if a code rate is different, a different shortening pattern may be used.

Tables 2 and 3 represent positions of groups to be shortened, or represent an order of groups to be shortened. That is, a shortening pattern π is used to indicate which bit group or column group should be shortened, and a shortening pattern π represents π(0)-th, π(1)-th, . . . , π(m−1)-th bit groups or column groups.

A shortening pattern will be described in detail using Table 4 below, by way of example.

TABLE 4

| π(0) | π(1) | π(2) | π(3) |
|---|---|---|---|
| 2 | 1 | 3 | 0 |

If input information bits are u={1 0 0 1 1 0 0 0 1 1 1 0 1 0 0 1} with ($K_1$=16), parity check matrix have parameters of $N_1$=24, and $M_1$=4, and a number of information bits to be obtained by shortening is 6, then a number of information bits to be shortened is 10. Because the number of column groups ($K_1/M_1$) is 4, a number of bit groups is 4. So, the information bits may be expressed as $\underline{u}_0$={1 0 0 1}, $\underline{u}_1$={1 0 0 0}, $\underline{u}_2$={1 1 1 0}, and $\underline{u}_3$={1 0 0 1}.

The number of bit groups in which all bits should be shortened is 2 because the number of information bits to be shortened is 10 and each bit group has 4 bits. Therefore, as shown in Table 4, shortening is performed on information bits corresponding to a third bit group $\underline{u}_2$ since π(0)=2, and shortening is performed on information bits corresponding to a second bit group $\underline{u}_1$ since π(1)=1. Additionally, because there are two more bits as information bits to be shortened, only two bits among information bits corresponding to a fourth bit group $\underline{u}_3$ are shortened based on π(2)=3.

In conclusion, the results obtained by shortening the information bits $\underline{u}_0$={1001}, $\underline{u}_1$={1000}, $\underline{u}_2$={1110}, and $\underline{u}_3$={1001} are $\underline{u}_0$={1001}, $\overline{\underline{u}}_1$={0000}, $\overline{\underline{u}}_2$={0000}, and $\overline{\underline{u}}_3$={0001}. That is, bits {1 0 0 1 0 0 0 0 0 0 0 0 0 0 0 1} are obtained by shortening input information bits $\underline{u}$={1 0 0 1 1 0 0 0 1 1 1 0 1 0 0 1}.

Figure 11:
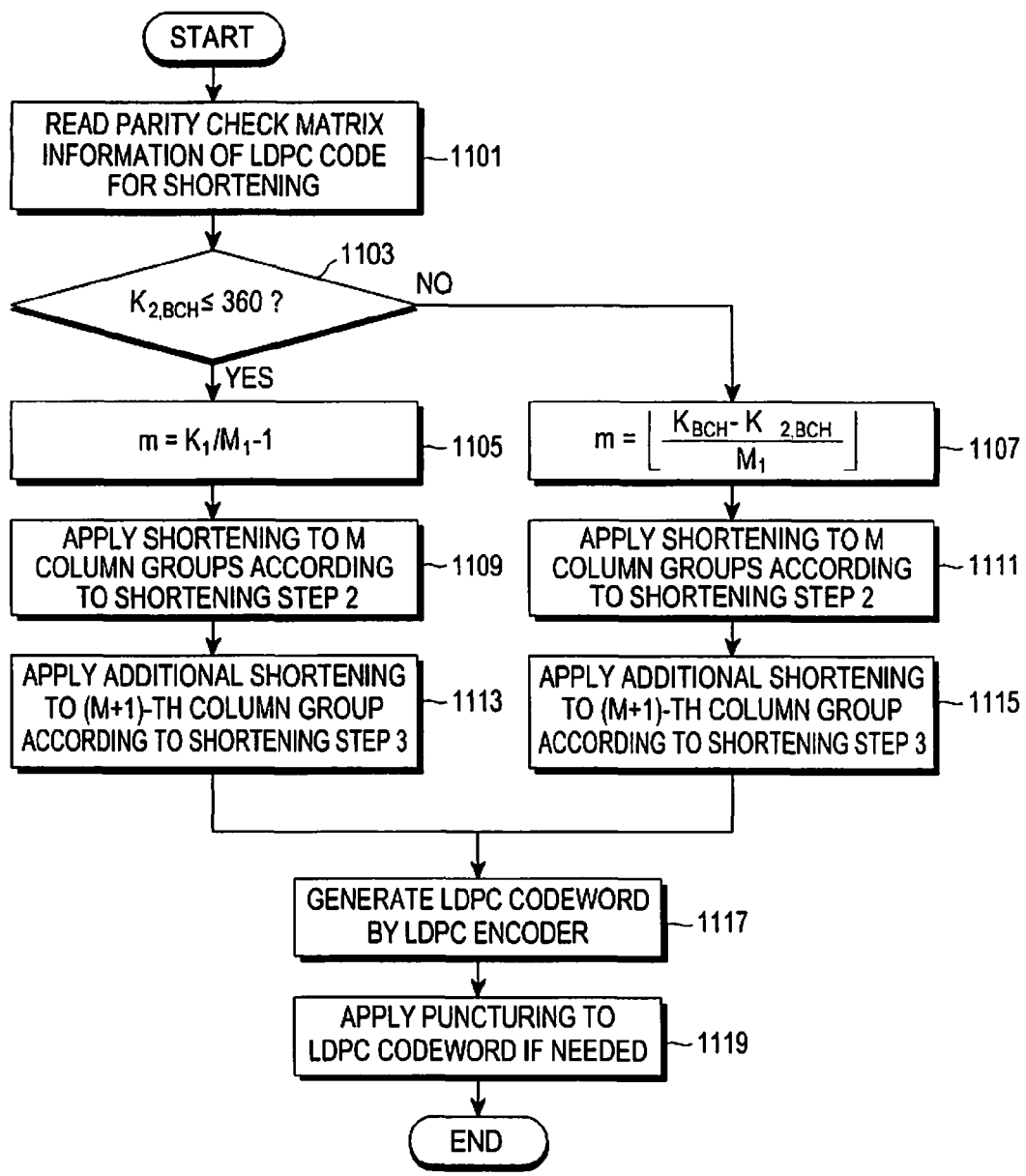
FIG. 11 is a flowchart illustrating a transmission operation in a transmission apparatus according to an embodiment of the present invention.

FIG. 11 illustrates an encoding operation of an LDPC encoder according to an embodiment of the present invention. Specifically, FIG. 11 illustrates a method for generating an LDPC code having a different codeword length or code rate using a given parity check matrix of an LDPC code.

In step 1101, an LDPC encoder 611 reads information about a parity check matrix of an LDPC code for shortening, or information such as weight-1 position sequences. Thereafter, the LDPC encoder 611 performs shortening according to a required length of an information word of an LDPC code based on the read information about a stored parity check matrix, through a shortening process including Shortening Steps 1-3, in steps 1103 to 1115.

Shortening Step 1: In step 1103, the LDPC encoder 611 determines whether $K_{2,BCH}$ is less than or equal to 360. Based on the determination results, the LDPC encoder 611 calculates a value of m for determining a number of bit or column groups to be shortened according to the length $K_{2,BCH}$ of an information word, after being shortened, as shown in Table 1, in steps 1105 and 1107. Specifically, when $K_{2,BCH}$ is less than or equal to 360, m is calculated using $K_1/M_1-1$ in step 1105, and when $K_{2,BCH}$ is not less than or equal to 360, $$m = \left\lfloor \frac{K_{BCH} - K_{2,BCH}}{M_1} \right\rfloor$$

in step 1107.

Shortening Step 2: The LDPC encoder 611 selects sequences for (m+1) bit or column groups according to Table 2 or 3, and shortens all bit or column groups corresponding to the first m sequences, in steps 1109 and 1111.

Shortening Step 3: The LDPC encoder 611 applies additional shortening to information bits in the remaining (m+1)-th bit or column group, or corresponding columns in the column group according to the value of m, as shown in Table 1, in steps 1113 and 1115.

In step 1117, the LDPC encoder 611 generates a codeword through LDPC encoding. Thereafter, if puncturing is required, the LDPC encoder 611 applies puncturing to the LDPC codeword in step 1119.

In accordance with an embodiment of the present invention, before step 1103, shortening or puncturing patterns may be determined differently according to a ratio of a number of shortened bits to a number of punctured bits.

Figure 12:
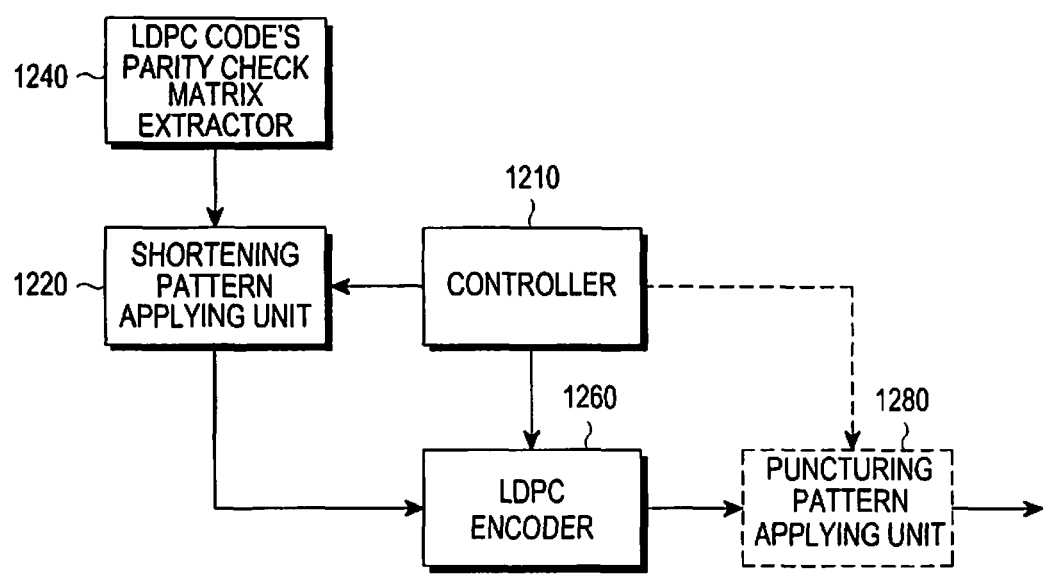
FIG. 12 is a block diagram illustrating an LDPC code-based transmission apparatus utilizing a shortening method according to an embodiment of the present invention.

FIG. 12 is a block diagram illustrating a transmission apparatus using a shortened LDPC code according to an embodiment of the present invention.

Referring to FIG. 12, the transmission apparatus includes a controller 1210, a shortening pattern applying unit 1220, an LDPC code's parity check matrix extractor 1240, an LDPC encoder 1260, and optionally includes a puncturing pattern applying unit 1280.

The LDPC code's parity check matrix extractor 1240 extracts a parity check matrix of an LDPC code, to which shortening is to be applied. The LDPC code's parity check matrix may be extracted using a memory, may be given in the transmission apparatus in advance, or may be directly generated in the transmission apparatus.

The controller 1210 controls the shortening pattern applying unit 1220 to determine a shortening pattern according to a length of an information word and a ratio of a number of bits to be shortened to a number of bits to be punctured. The shortening pattern applying unit 1220 inserts bits with a value of 0 or 1 in positions corresponding to shortened bits, or removes columns corresponding to shortened bits in a given parity check matrix of an LDPC code or uses only the columns which do not correspond to the shortened bits.

The shortening pattern may be determined by using a shortening pattern stored in a memory, by generating a shortening pattern using a sequence generator (not shown in the drawing), or by using a density evolution analysis algorithm for a parity check matrix and a given length of an information word.

The shortening pattern applying unit 1220 may apply a different shortening pattern according to a ratio of a number of shortened bits to a number of punctured bits, or to a code rate. Examples of shortening patterns determined according to the ratio of the number of shortened bits to the number of punctured bits are listed in Tables 2 and 3.

The shortening pattern applying unit 1220 may apply a different shortening pattern to a specific region having a different ratio of a number of shortened bits to a number of punctured bits, or a different code rate.

The LDPC encoder 1260 performs encoding based on the LDPC code shortened by the controller 1210 and the shortening pattern applying unit 1220. If application of appropriate puncturing is required, the puncturing pattern applying unit 1280 applies puncturing to the LDPC codeword generated by the LDPC encoder 1260.

Figure 13:
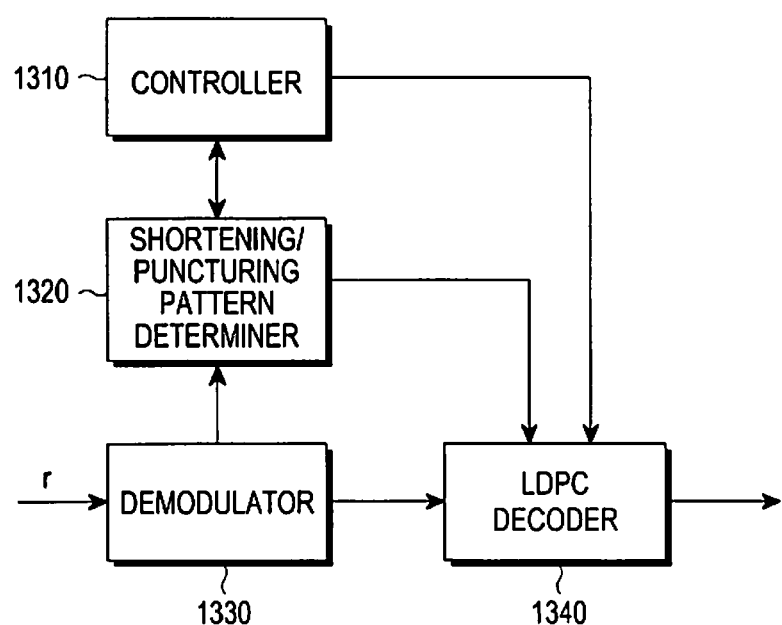
FIG. 13 is a block diagram illustrating an LDPC code-based reception apparatus utilizing a shortening method according to an embodiment of the present invention.

FIG. 13 is a block diagram illustrating a reception apparatus using a shortened LDPC code according to an embodiment of the present invention. Specifically, the reception apparatus illustrated in FIG. 13 receives a signal transmitted from a communication system using the shortened LDPC code, and restores user-desired data from the received signal by detecting a length of the shortened LDPC code and a ratio of a number of shortened bits to a number of punctured bits, from the received signal.

Referring to FIG. 13, the reception apparatus includes a controller 1310, a shortening/puncturing pattern determiner 1320, a demodulator 1330, and an LDPC decoder 1340.

The demodulator 1330 receives and demodulates a shortened LDPC code, and delivers the demodulated signal to the shortening/puncturing pattern determiner 1320 and the LDPC decoder 1340.

The shortening/puncturing pattern determiner 1320, under control of the controller 1310, estimates or determines information about a shortening or puncturing pattern of the LDPC code from the demodulated signal, and delivers position information of the shortened and/or punctured bits to the LDPC decoder 1340. The shortening/puncturing pattern determiner 1320 may deliver information about different patterns to the LDPC decoder 1340 according to a ratio of a number of shortened bits to a number of punctured bits.

The shortening/puncturing pattern determiner 1320 may determine or estimate a shortening or puncturing pattern by using a shortening pattern stored in a memory, by generating a shortening pattern using a sequence generator (not shown in the drawing), or by using a density evolution analysis algorithm for a parity check matrix and a given length of an information word. The shortening/puncturing pattern determiner 1320 may determine a different shortening or puncturing pattern according to the ratio of the number of shortened bits to the number of punctured bits.

The LDPC decoder 1340 restores user-desired data from the received signal using a length of the shortened/punctured LDPC code and positions of the shortened/punctured bits determined by the shortening/puncturing pattern determiner 1320.

Figure 14:
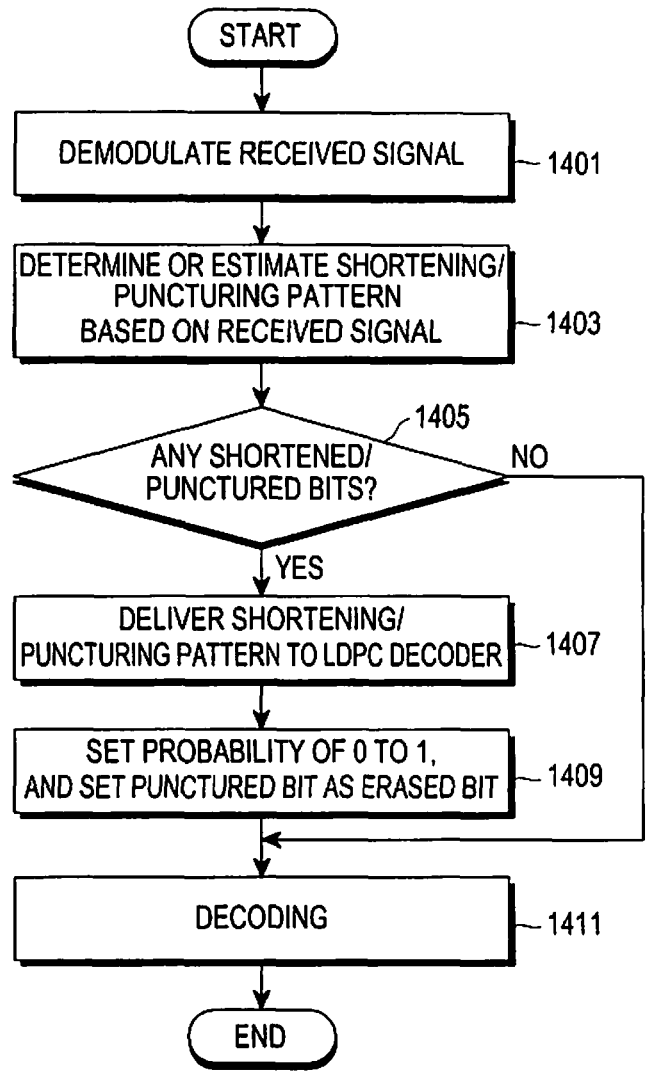
FIG. 14 is a flowchart illustrating a reception operation in a reception apparatus according to an embodiment of the present invention.

FIG. 14 illustrates a reception operation in a reception apparatus according to an embodiment of the present invention.

Referring to FIG. 14, in step 1401, the demodulator 1330 receives and demodulates a shortened LDPC code. In step 1403, the shortening/puncturing pattern determiner 1320 determines or estimates a shortening or puncturing pattern based on a ratio of a number of shortened bits to a number of punctured bits of the demodulated signal, or on a code rate. The shortening/puncturing pattern determiner 1320 may determine or estimate a different shortening or puncturing pattern for a specific region having a different ratio of the number of shortened bits to the number of punctured bits, or a different code rate.

In step 1405, the shortening/puncturing pattern determiner 1320 determines whether there are shortened/punctured bits.

If there are no shortened/punctured bits, the LDPC decoder 1340 performs decoding in step 1411. However, if there are shortened/punctured bits, the shortening/puncturing pattern determiner 1320 delivers position information of the shortened/punctured bits to the LDPC decoder 1340 in step 1407.

The LDPC decoder 1340 determines that a probability that values of the shortened bits will be 0 is 1, based on the position information of the shortened/punctured bits, and determines that the punctured bits are erased bits, in step 1409. Thereafter, the LDPC decoder 1340 performs LDPC decoding in step 1411.

As is apparent from the foregoing description, according to the described embodiments of the present invention, LDPC codewords having various codeword lengths or code rates can be generated using shortening and a parity check matrix given in a communication system using an LDPC code.

In addition, in accordance with an embodiment of the present invention, a shortening pattern is designed based on a ratio of a number of information bits to be shortened to a number of bits to be punctured, thereby supporting suboptimal performance of a shortened LDPC code.

Accordingly, the above-described embodiments of the present invention can optimize encoding/decoding performance using information about a parity check matrix given in a communication system using an LDPC code.

While the present invention has been shown and described with reference to certain embodiments thereof, it will be understood by those skilled in the art that various changes in form and details may be made therein without departing from the spirit and scope of the present invention as defined by the appended claims and their equivalents.

What is claimed is:

1. A method for channel encoding in a communication system using a Low-Density Parity Check (LDPC) code, comprising:
grouping information bits into a plurality of groups;
determining an order of the plurality of groups to be shortened, based on a ratio of a number of bits to be shortened to a number of bits to be punctured;
determining a length of information bits to be obtained by shortening the plurality of groups;

shortening the plurality of groups on a group basis in the determined order, based on the determined length of the information bits; and LDPC-encoding the shortened information bits.

2. The method of claim 1, wherein each of the plurality of groups includes at least one of a bit group and a column group.

3. The method of claim 1, wherein if a length of the LDPC codeword is 16200, a length of the information bits is 3240, and the ratio of the number of bits to be shortened to the number of bits to be punctured is 4/15 or 3/11, shortening is performed on $7^{th}$, $6^{th}$, $3^{rd}$, $5^{th}$, $2^{nd}$, $4^{th}$, $1^{st}$, $8^{th}$, and $0^{th}$ groups among the plurality of groups, in order, as defined in,

| Number of information bits to be shortened/number of bits to be punctured = 4/15, 3/11 | | | | | | | | |
|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
| 7 | 6 | 3 | 5 | 2 | 4 | 1 | 8 | 0 | and wherein if the length of the LDPC codeword is 16200, the length of the information bits is 3240, and the ratio of the number of bits to be shortened to the number of bits to be punctured is 2/7, shortening is performed on the $7^{th}$, $3^{rd}$, $6^{th}$, $5^{th}$, $2^{nd}$, $4^{th}$, $1^{st}$, $8^{th}$, and $0^{th}$ groups among the plurality of groups, in order, as defined in,

| Number of information bits to be shortened/number of bits to be punctured = 2/7 | | | | | | | | |
|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
| 7 | 3 | 6 | 5 | 2 | 4 | 1 | 8 | 0. |

4. An apparatus for channel encoding in a communication system using a Low-Density Parity Check (LDPC) code, comprising:

a parity check matrix extractor for grouping information bits into a plurality of groups, and determining an order of the plurality of groups to be shortened, based on a ratio of a number of bits to be shortened to a number of bits to be punctured;

a shortening pattern applying unit for determining a length of information bits to be obtained by shortening, and shortening the plurality of groups on a group basis in the determined shortening order, based on the determined length of the information bits; and an encoder for LDPC-encoding a shortened information bits.

5. The apparatus of claim 4, wherein if a length of the LDPC codeword is 16200, a length of the information bits is 3240, and the ratio of the number of bits to be shortened to the number of bits to be punctured is 4/15 or 3/11, the shortening pattern applying unit performs shortening on $7^{th}$, $6^{th}$, $3^{rd}$, $5^{th}$, $2^{nd}$, $4^{th}$, $1^{st}$, $8^{th}$, and $0^{th}$ groups among the plurality of groups, in order, as defined in,

| Number of information bits to be shortened/number of bits to be punctured = 4/15, 3/11 | | | | | | | | |
|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
| 7 | 6 | 3 | 5 | 2 | 4 | 1 | 8 | 0 | and wherein if the length of the LDPC codeword is 16200, the length of the information bits is 3240, and the ratio of the number of bits to be shortened to the number of bits to be punctured is 2/7, the shortening pattern applying unit performs shortening on the $7^{th}$, $3^{rd}$, $6^{th}$, $5^{th}$, $2^{nd}$, $4^{th}$, $1^{st}$, $8^{th}$, and $0^{th}$ groups among the plurality of groups, in order, as defined in,

| Number of information bits to be shortened/number of bits to be punctured = 2/7 | | | | | | | | |
|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
| 7 | 3 | 6 | 5 | 2 | 4 | 1 | 8 | 0. |

6. The apparatus of claim 4, wherein each of the plurality of groups includes at least one of a bit group and a column group.

7. A method for channel decoding in a communication system using a Low-Density Parity Check (LDPC) code, comprising:

demodulating a signal transmitted from a transmitter;

determining from the demodulated signal whether a shortened bit exists;

if the shortened bit exists, determining a group of the shortened bit using a shortening pattern determined based on a ratio of a number of bits to be shortened to a number of bits to be punctured by the transmitter; and decoding data using the determined group of the shortened bit, wherein the shortening pattern is determined on a group basis.

8. The method of claim 7, wherein if a length of the LDPC codeword is 16200, a length of information bits is 3240, and the ratio of the number of bits to be shortened to the number of bits to be punctured is 4/15 or 3/11, then $7^{th}$, $6^{th}$, $3^{rd}$, $5^{th}$, $2^{nd}$, $4^{th}$, $1^{st}$, $8^{th}$, and $0^{th}$ groups are determined, in order, as shortened groups, as defined in,

| Number of information bits to be shortened/number of bits to be punctured = 4/15, 3/11 | | | | | | | | |
|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
| 7 | 6 | 3 | 5 | 2 | 4 | 1 | 8 | 0 | and wherein if the length of the LDPC codeword is 16200, the length of the information bits is 3240, and the ratio of the number of bits to be shortened to the number of bits to be punctured is 2/7, then the $7^{th}$, $3^{rd}$, $6^{th}$, $5^{th}$, $2^{nd}$, $4^{th}$, $1^{st}$, $8^{th}$, and $0^{th}$ groups are determined, in order, as the shortened groups, as defined in,

| Number of information bits to be shortened/number of bits to be punctured = 2/7 | | | | | | | | |
|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
| 7 | 3 | 6 | 5 | 2 | 4 | 1 | 8 | 0. |

9. The method of claim 7, wherein the group includes at least one of a bit group and a column group.

10. An apparatus for channel decoding in a communication system using a Low-Density Parity Check (LDPC) code, comprising:
   a demodulator for demodulating a signal transmitted from a transmitter;
   a shortening pattern determiner for determining from the demodulated signal whether a shortened bit exists, and if the shortened bit exists, determining a group of the shortened bit using a shortening pattern determined based on a ratio of a number of bits to be shortened to a number of bits to be punctured; and
   a decoder for decoding data using the determined group of the shortened bit,
   wherein the shortening pattern is determined on a group basis.

11. The apparatus of claim 10, wherein if a length of the LDPC codeword is 16200, a length of information bits is 3240, and the ratio of the number of bits to be shortened to the number of bits to be punctured is 4/15 or 3/11, then $7^{th}$, $6^{th}$, $3^{rd}$, $5^{th}$, $2^{nd}$, $4^{th}$, $1^{st}$, $8^{th}$, and $0^{th}$ groups are determined, in order, as shortened groups, as defined in,

| Number of information bits to be shortened/number of bits to be punctured = 4/15, 3/11 | | | | | | | | |
|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
| 7 | 6 | 3 | 5 | 2 | 4 | 1 | 8 | 0 | and
wherein if the length of the LDPC codeword is 16200, the length of the information bits is 3240, and the ratio of the number of bits to be shortened to the number of bits to be punctured is 2/7, then the $7^{th}$, $3^{rd}$, $6^{th}$, $5^{th}$, $2^{nd}$, $4^{th}$, $1^{st}$, $8^{th}$, and $0^{th}$ groups are determined, in order, as the shortened groups, as defined in,

| Number of information bits to be shortened/number of bits to be punctured = 2/7 | | | | | | | | |
|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
| 7 | 3 | 6 | 5 | 2 | 4 | 1 | 8 | 0. |

12. The apparatus of claim 10, wherein the group includes at least one of a bit group and a column group.

* * * * *